United States Patent [19]

Onodera

[11] 4,106,953
[45] Aug. 15, 1978

[54] METHOD OF PRODUCING AN ION IMPLANTED TUNING DIODE

[75] Inventor: George C. Onodera, Phoenix, Ariz.

[73] Assignee: Motorola, Inc., Schaumburg, Ill.

[21] Appl. No.: 754,924

[22] Filed: Dec. 28, 1976

[51] Int. Cl.² .................... H01L 21/265; H01L 29/93
[52] U.S. Cl. .................................. 148/1.5; 357/14; 357/91
[58] Field of Search ............... 148/1.5, 175, 187, 188; 357/13, 14

[56] References Cited

U.S. PATENT DOCUMENTS

| 3,523,838 | 8/1970 | Heidenreich | 148/175 |
| 3,634,738 | 1/1972 | Leith et al. | 148/1.5 |
| 3,638,300 | 2/1972 | Foxhall et al. | 148/1.5 |

OTHER PUBLICATIONS

P. Brook et al., "Hyperabrupt Junctions . . . Diodes by Ion Implantation," Electronics Lett., vol. 4, (1968) 335.
R. A. Moline et al., "Ion–Implanted Hyperabrupt Junction Voltage Variable Capacitors" Proc. IEEE Trans. on Electron Devices, ED-19, 2/1972, 267.
W. H. Schroen, "The Impact of Process Control . . . ", Semiconductor Silicon, 1973 (ed. Huff et al.), Princeton, N. J., 738.
J. Sansbury, "Appl. Ion–Implantation in Semiconductor–Processing", Solid State Tech., 11/1976, 32.

Primary Examiner—L. Dewayne Rutledge
Assistant Examiner—Upendra Roy
Attorney, Agent, or Firm—John A. Fisher

[57] ABSTRACT

Semiconductor devices with special reference to the process for fabricating tuning diodes. This invention includes the super-position of a multiplicity of ion implants and thermal redistribution cycles for the purpose of establishing a particular distribution of dopant atoms in the electrically active portion of the device.

7 Claims, 14 Drawing Figures

4,106,953

METHOD OF PRODUCING AN ION IMPLANTED TUNING DIODE

BACKGROUND OF THE INVENTION

This invention relates to a semiconductor device and its fabrication; and more particularly to a hyperabrupt junction tuning diode and a method of fabrication which results in a tighter range of process control and improved electrical characteristics.

A tuning diode is a semiconductor device used as a voltage variable capacitor. The capacitance of the devices varies as the reverse bias voltage across the device is changed according to the equation:

$$dc/dv = C^3/KN(x)$$

where $K$ is a constant

Circuit applications of tuning diodes require that the capacitance vary with voltage in a prescribed manner and that this capacitance-voltage response be reproducible from device to device. The capacitance-voltage response is governed by the term $N(x)$ in the above equation where $N(x)$ is the doping density in the bulk of the tuning diode as a function of the distance $x$ away from the diode junction. For conventional diodes the capacitance varies approximately as the square root of the voltage for shallow step junctions and approximately as the cube root of the voltage for deeper, linearly graded junctions. For tuning diodes the capacitance response is often required to be a stronger function of the voltage than the cube root or square root response of conventional diodes. This requires a particular tailoring of the doping distribution, $N(x)$, for the fabrication of a tuning diode with a given capacitance response. This has been accomplished, for example, by fabricating the tuning diode in an epitaxial layer of silicon having a carefully retrograded impurity profile. (Heidenreich, U.S. Pat. No. 3,523,838.) Control of the characteristics of the diode then becomes the problem of controlling a very difficult epitaxial layer deposition process.

SUMMARY OF THE INVENTION

It is the object of this invention to provide an improved process for the fabrication of semiconductor tuning diodes. More particularly it is the object of this invention to provide an improved process for the fabrication of variable capacitance tuning diodes having a desired capacitance-voltage response and a high Q value.

A primary feature of the invention involves the use of multiple ion implantations and subsequent redistributions to establish the desired distribution of impurity atoms within the semiconductor device. By use of these multiple ion implantations a difficult to control epitaxial growth step is eliminated. Once the desired capacitance-voltage relationship is determined for a particular tuning diode, a calculation is performed to establish the doping distribution, $N(x)$, required to give that relationship. A further calculation is then performed to determine the optimum ion implantations to superimpose to approximate the required doping distribution. Once so designed, the tuning diode can be fabricated by a combination of ion implantation and conventional processing.

DETAILED DESCRIPTION OF THE INVENTION

Figure 1:
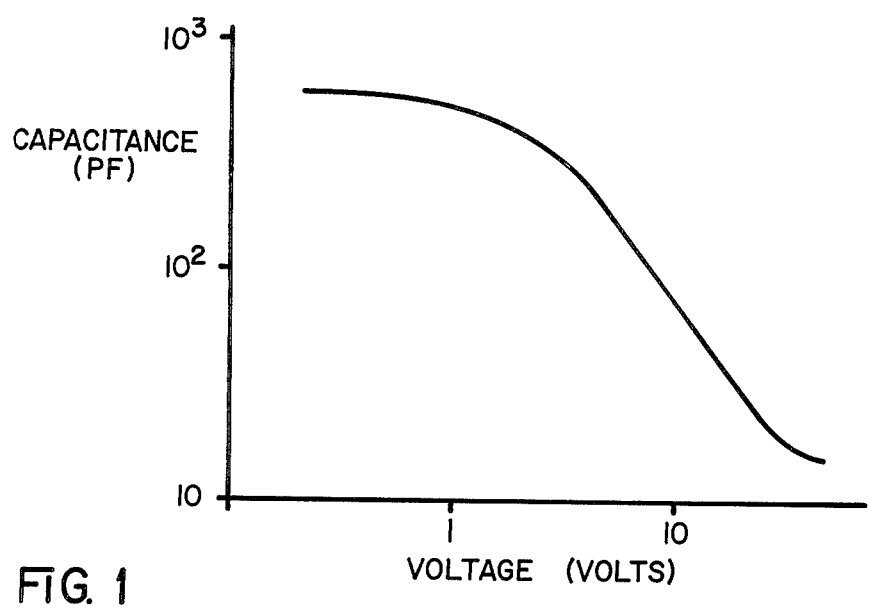
FIG. 1 is a plot of an example of a desired tuning diode capacitance-voltage response curve.

This invention can be understood by consideration of the following detailed description which first discusses design considerations and then details an appropriate process sequence. FIG. 1 shows on a logarithmic scale a plot of capacitance versus voltage which is assumed for the purposes of this discussion to be the desired response of capacitance to voltage for the tuning diode to be designed.

Given the capacitance-voltage response curve of FIG. 1, the distribution of doping atoms, $N(x)$, needed to achieve this response can be calculated from the equation:

$$dc/dv = C^3/KN(x)$$

Figure 2:
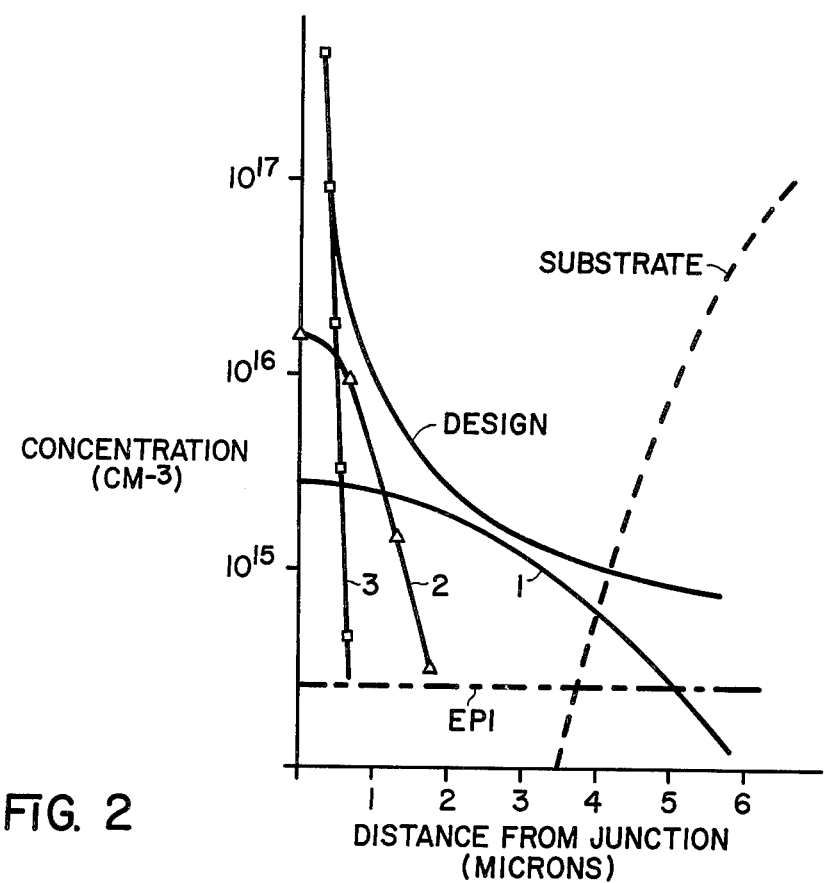
FIG. 2 is a plot showing the required dopant distribution for fabrication of a specific tuning diode. Also shown are the individual dopant distributions of a substrate wafer, an epitaxial layer, and three separate ion implantations employed in the fabrication of that specific tuning diode.

The results of this calculation are shown in FIG. 2 by the curve labeled "design." Also shown in FIG. 2 are the three curves labeled 1, 2, 3. These three curves are truncated Gaussian distribution curves which, when superimposed, add up to a close approximation of the desired design curve. It is well known that the distribution of implanted atoms following an ion implantation and redistribution can be approximated by a Gaussian distribution function.

The center of that distribution is characterized by the range of the implant. The range is determined by the particular ion implanted (phosphorus in this description), by the energy of the implant, and by the presence or absence of an oxide layer on the surface of the silicon. The dose describes the number of ions implanted per unit area. The final form of the distribution is then determined by the redistribution cycle and is governed by the usual laws of diffusion.

Thus by selecting the proper ion implant dose and energy and subsequently by redistributing that implant at the proper temperature for the correct length of time the three curves 1, 2, 3 of FIG. 2 can each be separately realized.

To fabricate a tuning diode with a high Q factor, it is necessary to minimize any resistance in series with the diode. This is accomplished by fabricating the diode in an epitaxial layer grown on a heavily doped and, therefore, low resistance substrate. The doping profiles of both the epitaxial layer and the heavily doped substrate are also shown in FIG. 2. To ease the processing and to minimize any dependence on the resistivity of the epitaxial layer, the doping density of that layer is kept far below the level desired for the finished device. In effect, most of the final doping in the epitaxial layer is added by the ion implantation steps. Out diffusion of the heavily doped substrate resulting from all of the high temperature steps in the process is indicated in FIG. 2.

Figure 3:
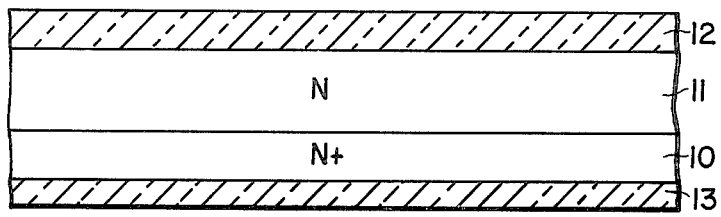
FIGS. 3–14 illustrate elevational cross-sectional views of a series of steps showing the fabrication process for producing an ion implanted tuning diode in accordance with the method of this invention.

FIG. 3 illustrates a passivated epitaxial silicon wafer prepared as an intermediate step in the fabrication of the tuning diode of the invention. The substrate 10 is a monocrystalline silicon wafer doped with arsenic to an impurity concentration of approximately $10^{18}$ cm$^{-3}$. Other n-type dopants such as antimony or phosphorus could be substituted for the arsenic. This substrate wafer can be approximately 15 mils in thickness. The layer 11 is an n-type epitaxial layer of silicon grown by conventional techniques. This layer is doped with phosphorus or arsenic to a concentration of approximately $2-5 \times 10^{14}$ cm$^{-3}$ and has a thickness of 8-11 microns. The silicon wafer 10 with epitaxial layer 11 is then oxidized to form silicon dioxide layers 12 and 13. This can be accomplished, for example, by placing the wafer in a steam ambient at a temperature of 975° C for 210 minutes. This will give oxide layers 12 and 13 of approximately 7500Å.

Figure 4:
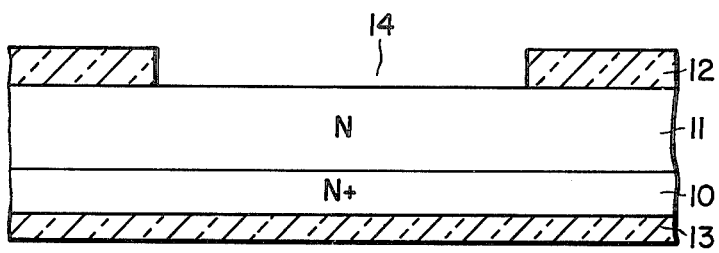

In FIG. 4 a window 14 has been opened in oxide layer 12 by using well known photolithographic masking and etching techniques. During this etch step the oxide layer 13 on the back of the wafer is protected from etching by a layer of photoresist. It is desirable to keep oxide layer 13 intact to prevent out diffusion of dopant atoms from the heavily doped back of wafer 10 and subsequent diffusion of these dopant atoms into critical device areas on the front of the wafer such as into window 14.

Figure 5:
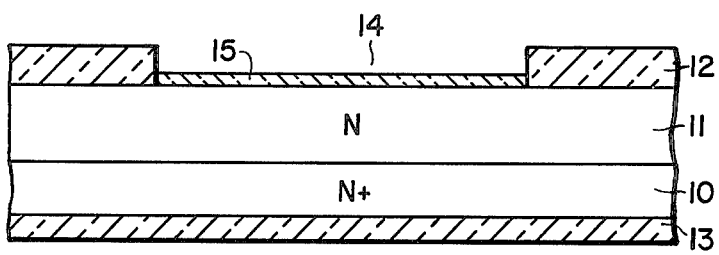

FIG. 5 shows the regrowth of a thin oxide layer 15 in window area 14. This oxide layer 15 can be grown to a thickness of a few hundred Angstroms by heating in a dry oxygen ambient at 1100° C for 10 minutes. Oxide layer 15 prevents contamination of the surface of epitaxial layer 11 during subsequent heat cycles.

Figure 6:
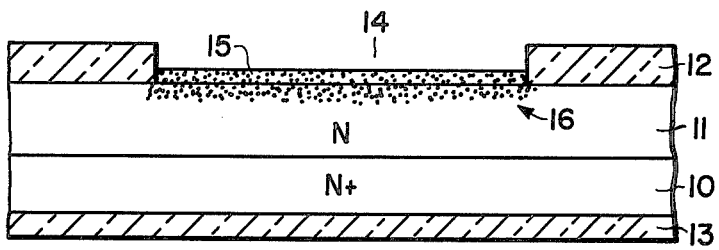

FIG. 6 shows the first ion implant 16 through oxide layer 15. This implant enters the silicon only through window 14 because oxide 12 is sufficiently thick to stop all ions are implanted thereon before they reach the silicon. Thus ions are selectively implanted into portions of the epitaxial layer 11 which are not protected by oxide layer 12. In this step $8 \times 10^{11}$ phosphorus ions per square centimeter are implanted at an energy of 150 KeV.

Figure 7:
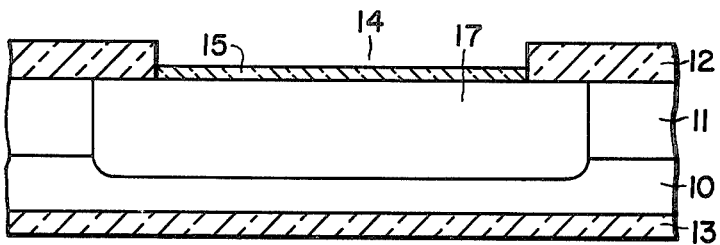

In FIG. 7 the first ion implant 16 has been partially redistributed forming doped region 17. The redistribution will be completed in subsequent steps. The partial redistribution of phosphorus implant 16, represented as doped region 17 in FIG. 7 can be accomplished by heating the wafer at 1200° C for 6 hours in an ambient of ½% $O_2$ and 99½% $N_2$. The small percentage of oxygen prevents damage to the silicon surface that might be caused by high temperature pure nitrogen. This small amount of oxygen does not, however, grow an appreciable amount of silicon dioxide on the wafer.

Figure 8:
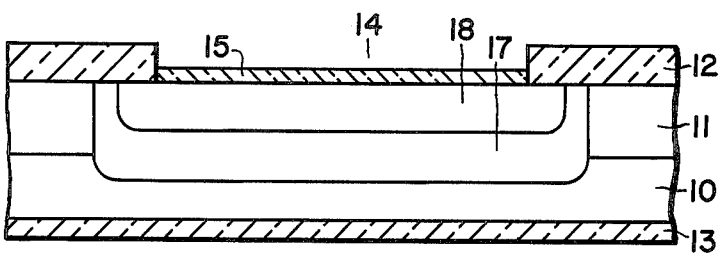

FIG. 8 schematically represents the partially fabricated tuning diode after the second ion implant and redistribution cycle forming second doped region 18. During this step, $1.6 \times 10^{12}$ phosphorus ions per square centimeter are implanted at an energy of 150 KeV. Because of the masking properties of the oxide layer 12, phosphorus ions are implanted into the silicon only through window 14. Partial redistribution of implanted regions 17 and 18 is accomplished by heating the wafer to 1200° C for 40 minutes in an ambient of ½% oxygen and 99½% nitrogen.

Figure 9:
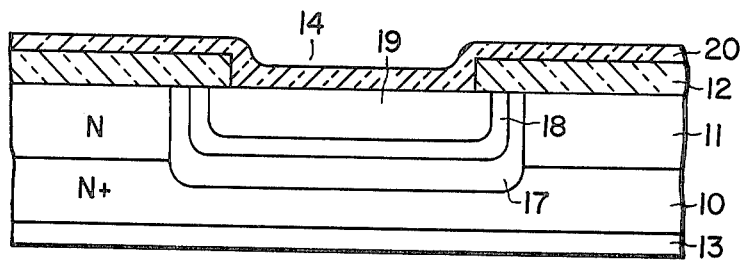

FIG. 9 shows that the protective oxide layer 15 has been removed by etching the wafer in a suitable solution of dilute hydrofluoric acid completely reopening window area 14. Third doped region 19 is then formed by a third ion implantation through window 14 followed by a third redistribution cycle. Because of the critical nature of the total amount of dopant and of the distribution of that dopant within doped region 19, two extra precautions are taken. The first precaution is the removal of oxide layer 15 prior to the implant operation. This is done to remove any ambiguities that might exist in knowing precisely the thickness of oxide layer 15 and thus the amount that layer could perturb the implant as ions were implanted through it. Second, the total desired dose of $2 \times 10^{14}$ phosphorus ions per square centimeter at an energy of 150 KeV is accomplished by two separate ion implantations each of $1 \times 10^{14}$ ions per square centimeter. These two implants are done at different physical locations within the ion implant machine in order to randomize any variations caused by nonuniformities within the machine. After the completion of the ion implantation, a layer of silicon dioxide 20 is deposited on oxide layer 12 and the exposed surface of silicon layer 11. This oxide layer 20 is deposited by conventional chemical vapor deposition techniques at approximately 750° C and can be 4000 to 5000 Angstroms thick. The final redistribution cycle is then done by heating the wafer for 20 minutes at 1040° C in an ambient of ½% oxygen and 99½% nitrogen.

The three doped regions 17, 18, 19 formed by three separate ion implantations and three separate but cummulative redistribution cycles now have phosphorus doping distributions approximately the same as those shown in curves 1, 2, 3, respectively, in FIG. 2.

Figure 10:
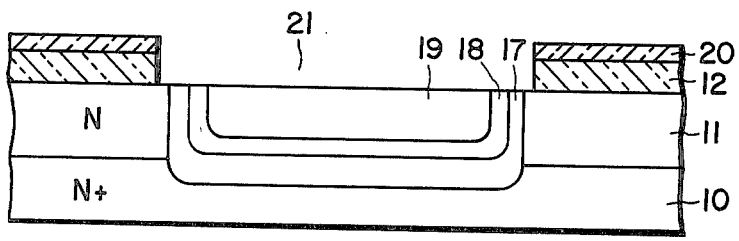

In FIG. 10, the oxide layers 12 and 20 have been patterned using conventional photolithographic techniques to provide an opening 21 in said oxide layers and to expose selected portions of the surface layer 11 including portions of regions 17, 18, 19. During the etching of oxide layers 12 and 20, the oxide layer 13 is also removed.

Figure 11:
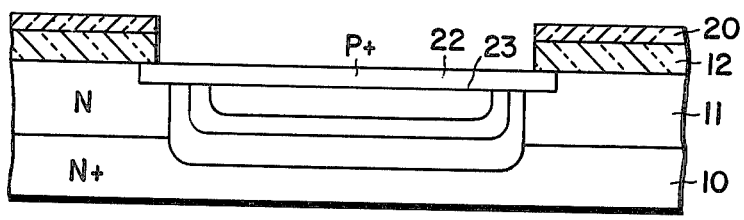

In FIG. 11 a P+ or boron rich region 22 has been formed by the diffusion of boron through oxide opening 21. The region 22 can be formed by conventional diffusion techniques using any of a number of boron diffusion sources such as BN, $BCl_3$, $B_2O_3$ or $BBr_3$. Region 22 is a low resistivity region with a junction depth of approximately 3000Å. The diffusion of P-type region 22 forms a PN junction 23 with the N-type regions 11, 17, 18, 19.

Figure 12:
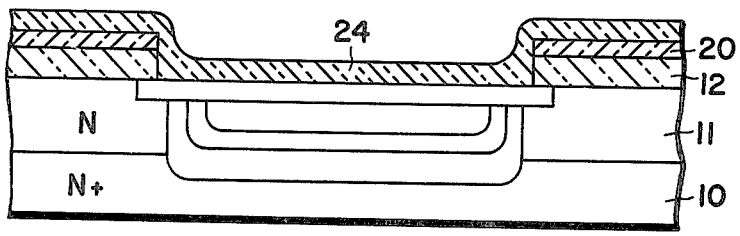

In FIG. 12 a silicon dioxide layer 24 is deposited on the device covering oxide layer 20 and P+ region 22. Layer 24 is deposited by conventional chemical vapor deposition techniques and can be 4000 to 5000 Angstroms thick.

Figure 13:
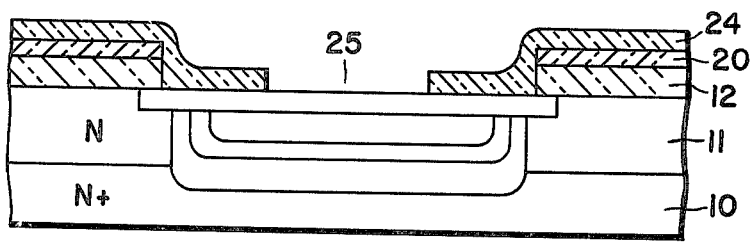

In FIG. 13 an opening 25 has been cut in oxide layer 24 to provide a means for contacting P+ region 22. Opening 25 can be accomplished by conventional photolithographic and etching techniques.

Figure 14:
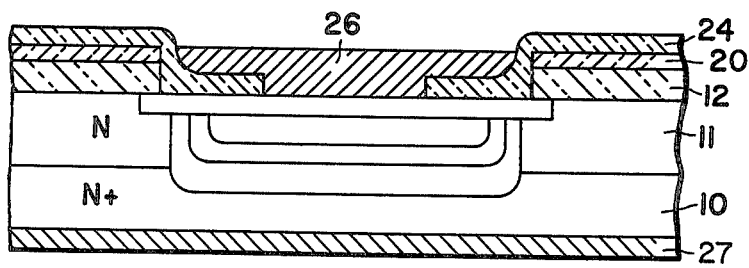

In FIG. 14 the completed structure is represented. A front metal contact 26 is provided to contact the P+ region 22. Contact 26 can be realized by evaporating a metal layer, preferably a layer of aluminum or an alloy of aluminum, on the front surface of the wafer in contact with 24 and the exposed surface of 22. Said metal layer is then patterned in the conventional manner. Contact to the back of the wafer is accomplished by first thinning the N+ region 10 to a thickness of about 6 mils by abrading and etching. Upon the surface of the thinned region 10 is then evaporated a layer of gold 27 which serves as the electrical contact to the N-type side of the PN junction tuning diode.

For purposes of clear illustration a very specific example has been described in this detailed description. The process outlined has been for a specific tuning diode having a specific capacitance-voltage response. It will be appreciated that other tuning diodes having other capacitance-voltage responses can be fabricated using the teachings of this invention; that is, a plurality of ion implantations and redistributions superimposed to provide the required doping distribution. Depending upon the doping distribution required, the number of ion implantations to be superimposed, the dose and energy of those implantations, and the redistribution cycle to be afforded to each implantation may have to be modified. It will also be appreciated that different tuning diodes might require a change in the thickness of epitaxial layer 11 or in the depth of P+ diffused region 22.

What is claimed is:

1. A method for producing a semiconductor device having a predetermined capacitance-voltage characteristic resulting from a particular doping distribution comprising the steps of:
   a. providing a semiconductor body having a high resistivity epitaxial layer of a first conductivity type on a low resistivity wafer of the same conductivity type;
   b. oxidizing the surfaces of said semiconductor body to provide an oxide layer thereon;
   c. selectively removing said oxide layer from said semiconductor body to define an opening on said epitaxial layer;
   d. implanting first ions through said opening and into said epitaxial layer;
   e. thermally redistributing said first implanted ions;
   f. implanting second ions through said opening and into said epitaxial layer;
   g. thermally redistributing said first and said second implanted ions;
   h. implanting third ions through said opening and into said epitaxial layer;
   i. thermally redistributing said first, said second, and said third implanted ions; and
   j. forming a PN junction in said semiconductor body by diffusing a conductivity determining impurity into said ion implanted epitaxial layer.

2. The method of claim 1 further comprising the step of reoxidizing said semiconductor body before implanting said first ions.

3. The method of claim 1 wherein said thermal redistributions are done in an atmosphere of about $\frac{1}{2}\%$ oxygen and about $99\frac{1}{2}\%$ nitrogen.

4. The method of claim 1 wherein said epitaxial layer is doped to a concentration in the range of $2-5 \times 10^{14}$ cm$^{-3}$.

5. The method of claim 4 wherein said first ions are implanted at an energy of about 150 KeV and a dose of about $8 \times 10^{11}$ ions per square centimeter and wherein said ions are phosphorus ions.

6. The method of claim 5 wherein said second ions are implanted at an energy of about 150 KeV and a dose of about $1.6 \times 10^{12}$ ions per square centimeter and wherein said ions are phosphorus ions.

7. The method of claim 6 wherein said third ions are implanted at an energy of about 150 KeV and a dose of about $2 \times 10^{14}$ ions per square centimeter and wherein said ions are phosphorus ions.

* * * * *